United States Patent
Kise et al.

(10) Patent No.: US 7,885,312 B2
(45) Date of Patent: Feb. 8, 2011

(54) SURFACE EMITTING SEMICONDUCTOR LASER ELEMENT

(75) Inventors: Tomofumi Kise, Tokyo (JP); Noriyuki Yokouchi, Tokyo (JP)

(73) Assignee: Furukawa Electric Co., Ltd., Tokyo (JP)

(*) Notice: Subject to any disclaimer, the term of this patent is extended or adjusted under 35 U.S.C. 154(b) by 55 days.

(21) Appl. No.: 12/219,997

(22) Filed: Jul. 31, 2008

(65) Prior Publication Data

US 2008/0298420 A1    Dec. 4, 2008

Related U.S. Application Data

(63) Continuation of application No. PCT/JP2007/054653, filed on Mar. 9, 2007.

(30) Foreign Application Priority Data

Mar. 9, 2006    (JP) .............................. 2006-064247

(51) Int. Cl.
    *H01S 3/08* (2006.01)
(52) U.S. Cl. .................. 372/99; 372/50.11; 372/98
(58) Field of Classification Search .................. 372/98, 372/50.11, 99
    See application file for complete search history.

(56) References Cited

U.S. PATENT DOCUMENTS

| 6,711,200 | B1* | 3/2004 | Scherer et al. ................. 372/64 |
| 7,462,873 | B2* | 12/2008 | Hoshi et al. .................... 257/88 |
| 2004/0247009 | A1* | 12/2004 | Noda et al. ..................... 372/99 |
| 2004/0252741 | A1* | 12/2004 | Meyer et al. ................... 372/67 |
| 2005/0089075 | A1* | 4/2005 | Baba et al. ..................... 372/50 |
| 2006/0093008 | A1* | 5/2006 | Mochizuki ............... 372/50.23 |
| 2006/0120414 | A1* | 6/2006 | Hori ............................ 372/21 |

FOREIGN PATENT DOCUMENTS

| JP | 2005-311175 | 11/2005 |
| JP | 2005-353623 | 12/2005 |

OTHER PUBLICATIONS

"IEEE Journal of Selected Topics in Quantum Electronics", vol. 9, No. 5, pp. 1439-1445, Sep./Oct. 2003.

* cited by examiner

*Primary Examiner*—Tod T Van Roy
(74) *Attorney, Agent, or Firm*—Kubotera & Associates LLC

(57) ABSTRACT

A surface emitting laser is provided with an upper reflecting mirror having a photonic crystal structure with a point defect at the center, and emits a laser beam from the side of a lower reflecting mirror. An upper electrode is formed on the point defect at the center, and element resistance is reduced. A material transparent to a wavelength of the laser beam is used for a substrate. The emission efficiency is improved by reducing the element resistance of the photonic crystal surface emitting laser.

8 Claims, 4 Drawing Sheets

SURFACE EMITTING SEMICONDUCTOR LASER ELEMENT

CROSS-REFERENCE TO RELATED APPLICATION

This is a continuation application of the prior PCT application PCT/JP2007/054653, filed on Mar. 9, 2007, which is claiming the priority to Japanese Patent Application No. 2006-064247, filed on Mar. 9, 2006.

BACKGROUND OF THE INVENTION AND RELATED ART STATEMENT

The present invention relates to a surface emitting semiconductor laser element, and, more particularly, relates to a surface emitting semiconductor laser capable of achieving fundamental transverse mode oscillation.

In a vertical cavity surface emitting semiconductor laser element (VCSEL; referred to simply as a surface emitting laser hereinafter), a resonation direction of light is perpendicular to a substrate surface, as the term indicates. The surface emitting laser has attracted a significant attention as a light source for communication, or a variety of devices in a sensor application.

The reason for the attention described above has been based on the following advantages. As opposed to a conventional edge-emitting laser, in the surface emitting laser, elements are easily arranged in a two-dimensional arrangement. It is not necessary to provide a cleavage for installing a mirror, so that a wafer-level test is possible. Further, an active layer has an extremely small volume. Accordingly, it is possible to oscillate the surface emitting laser at an extremely lower threshold, thereby reducing power consumption.

Especially, the surface emitting laser has an extremely small cavity length. Accordingly, it is possible to easily achieve fundamental mode oscillation in terms of a longitudinal mode of oscillation spectrum. On the other hand, the surface emitting laser does not have a control mechanism. Accordingly, the surface emitting laser tends to generate a plurality of higher order modes in terms of a transverse mode. When a laser beam oscillated with higher order transverse modes is used for optical transmission, a signal thereof is susceptible to degradation proportional to a transmission distance, especially during high-speed modulation. Thus, in the surface emitting laser, a variety of structures have been proposed as a measure for facilitating the fundamental transverse mode oscillation.

In order to obtain the fundamental transverse mode oscillation in a simple manner, an area of a luminescence region is reduced to an extent that only the fundamental mode can oscillate. For example, when the surface emitting laser has an oxidation constriction confinement structure including an AlAs layer selectively oxidized and an oscillation wavelength within an 850 nm band, a refractive index difference between a non-oxidized region and an oxidized region ($Al_2O_3$) in the AlAs layer becomes large. Accordingly, it is necessary to reduce an area of a luminescence region less than about 10 $\mu m^2$ in order to achieve the fundamental transverse mode oscillation.

Generally, in the surface emitting laser having such an oxidization constriction confinement structure, a current constriction width, which controls an area of a luminescence region, is determined by an oxidized layer formed through selectively oxidizing a peripheral region of the AlAs layer. In order to form an aperture such that the area of the luminescence region becomes less than about 10 $\mu m^2$ through form-ing the oxidized layer, it is necessary to precisely control the oxidization process, thereby lowering a product yield. In addition, when the area of the luminescence region is reduced, not only an output thereof is lowered but also an element resistance increases, thereby increasing a voltage applied to the surface emitting laser.

In the surface emitting laser, in order to increase the area of the luminescence region and achieve the fundamental transverse mode oscillation, a photonic crystal surface emitting laser has been proposed in a reference, for example, "IEEE Journal of Selected Topics in Quantum Electronics", Vol. 9, No. 5, pp. 1439-1445, September/October 2003. FIG. 9 is a perspective view showing the conventional surface emitting laser disclosed in the reference, and FIG. 10 is a plan view thereof.

The conventional photonic crystal surface emitting laser 200 shown in FIG. 9 and FIG. 10 is designed to have an oscillation wavelength of 850 nm. In the photonic crystal surface emitting laser 200, a lower reflecting mirror structure 41 formed of 35 pairs of multilayer films in which p-type $Al_{0.8}Ga_{0.2}As$ and p-type $Al_{0.2}Ga_{0.8}As$ each of which has a thickness of $\lambda/4n$ (where $\lambda$ is an oscillation wavelength and n is a refractive index) are alternately laminated, is formed on, for example, a p-type GaAs substrate 40 using an MOCVD method. A lower cladding layer (not shown), a luminescence layer 42 constituted by 4 layers of $GaAs/Al_{0.2}Ga_{0.8}As$ quantum well structure, and an upper cladding layer (not shown) are sequentially laminated on the lower reflecting mirror structure 41. Further, an upper reflecting mirror structure 43 formed of 25 pairs of alternately laminated n-type $Al_{0.8}Ga_{0.2}As$ and n-type $Al_{0.2}Ga_{0.8}As$ each of which has a thickness of $\lambda/4n$, is formed on the upper cladding layer. An n-type GaAs layer is formed on a surface of an uppermost layer of the upper reflecting mirror structure. In order to perform a selective oxidation process, a portion of the above structure up to at least a top surface of the lower reflecting mirror structure is removed by etching, and a mesa post 49, i.e., a layered structure with a column shape, is formed in a central portion.

Inside the mesa post 49 having the layered structure with the column shape, a two-dimensional hole arrangement is formed by electron beam lithography and dry-etching. The hole arrangement has a point defect region 32 with no hole formed therein in a central portion thereof. A period of an arrangement of circular holes 45 is, for example, 3 to 5 $\mu m$, and a depth of the circular holes 45 corresponds to that of 20 pairs of the upper reflecting mirror structure 43. An upper electrode 44 formed of, for example, AnGeNi/Au is formed on an outer periphery of the hole arrangement, and a lower electrode 47 formed of, for example, Ti/Pt/Au is formed on a backside surface of the substrate 40.

In the photonic crystal surface emitting laser mentioned above, a p-type AlAs layer is formed near an uppermost layer of the lower reflecting mirror structure 41 (i.e. near a luminescence layer). A mesa post outer periphery of the p-type AlAs layer is selectively oxidized to form an insulation region formed of $Al_2O_3$, whereby a current constriction structure 46 relative to the luminescence layer is formed.

The photonic crystal surface emitting laser 200 shown in FIG. 9 and FIG. 10 has a lamination structure in which the active layer (or the luminescence layer) 42 is disposed between the upper reflecting mirror structure 43 and the lower reflecting mirror structure 41 formed on the substrate 40. A reflectivity of the upper reflecting mirror structure 43 is lower than that of the lower reflecting mirror structure 41, so that a laser beam 48 is emitted through the upper reflecting mirror structure 43. A plurality of holes 45 arranged in the two-dimensional pattern is formed in the upper reflecting mirror structure 43, and in the central region of the two-dimensional pattern, a defect of hole, in which no hole is present, is provided. In the above-mentioned structure, a refractive index in the defect region where no hole is present is slightly greater than a refractive index in the peripheral region where the holes are arranged in the two-dimensional periodic pattern. With the slight difference between the refractive indexes, the region where the holes are arranged two-dimensionally acts as a clad while the central defect region where no hole is present acts as a core. Thus, the transverse mode control is performed based on a weak optical confinement, whereby an area of the luminescence layer in which only a fundamental transverse mode can oscillate is enlarged.

In the above-mentioned photonic crystal surface emitting laser, the laser oscillation occurs in the luminescence layer upon current injection. The oscillated laser beam is emitted through the upper reflecting mirror structure, having a lower reflectivity than the lower reflecting mirror structure. The laser oscillation occurs in a fundamental and single mode based on the transverse mode control mechanism defined by the slight difference between the refractive indexes of the central point defect region 32 and the peripheral two-dimensional hole arrangement region.

However, in the conventional photonic crystal surface emitting laser as shown in FIG. 9 and FIG. 10, which has the current constriction structure such as the oxidization constriction or the ion-implantation constriction, the two-dimensionally arranged holes are situated in the middle of a current injection path from the upper electrode 44 formed on the outer periphery of the hole arrangement region to the current injection region in the active layer. Accordingly, an electrical resistance of the element tends to increase greater than 100 ohms. Therefore, there are problems such that the light emission efficiency becomes small and a high voltage needs to apply. Furthermore, the manufacturing process of the oxidization constriction structure or ion-implantation constriction structure tends to be complicated, so that the adoption of an optimized structure of laser emission is restricted.

SUMMARY OF THE INVENTION

In view of the abovementioned problems of the conventional photonic crystal surface emitting laser, it is an object of the present invention to provide a photonic crystal surface emitting laser with an improved light emission efficiency through improving the current constriction structure for the current injection. In the photonic crystal surface emitting laser, it is easy to manufacture and oscillate in a single transverse mode.

According to an aspect of the present invention, a surface emitting semiconductor laser element includes a lamination structure formed on a substrate, in which a luminescence layer is disposed between an upper reflecting mirror structure and a lower reflecting mirror structure.

The lower reflecting mirror structure has a reflectivity smaller than a reflectivity of the upper reflecting mirror structure.

A two-dimensional hole arrangement with a hole defect having no hole formed therein at a central portion thereof is formed in the upper reflecting mirror structure to achieve a laser oscillation in a fundamental transverse mode.

An upper electrode is formed at the central portion of the two-dimensional hole arrangement.

In the surface emitting laser according to the present invention, the upper electrode is disposed in the central portion with the hole defect of the upper reflecting mirror structure having the two-dimensional hole arrangement. Accordingly, light confinement based on a difference in the refractive indexes of the two-dimensional hole arrangement and the hole defect becomes mild, so that it is possible to oscillate in a single mode over a wide area. In addition, it is possible to inject a current intensively into the defect hole region with a resistance lower than that of a surrounding region thereof, thereby obtaining a lower element resistance. In the surface emitting laser according to the present invention, the upper electrode is formed in the central portion of the upper reflecting mirror structure.

Accordingly, a laser light is emitted through the lower reflecting mirror structure. For this purpose, the lower reflecting mirror structure has the reflectivity smaller than that of the upper reflecting mirror structure. A current constriction structure is formed of a photonic crystal structure. Accordingly, it is not necessary to perform a complicated current constriction process such as an oxidation constriction or an ion-implanting constriction, thereby improving a product yield.

In the surface emitting laser according to the present invention, it is preferred that the two-dimensional hole arrangement is formed in a p-type semiconductor portion, where carriers (holes) have a low mobility and the current constriction is easy. That is, an n-type substrate is preferably used. Furthermore, when a GaAs substrate is used for obtaining the laser light from a substrate side, the surface emitting laser is configured to have an oscillation wavelength longer than a band-gap wavelength of GaAs.

DETAILED DESCRIPTION OF PREFERRED EMBODIMENTS

Figure 1:
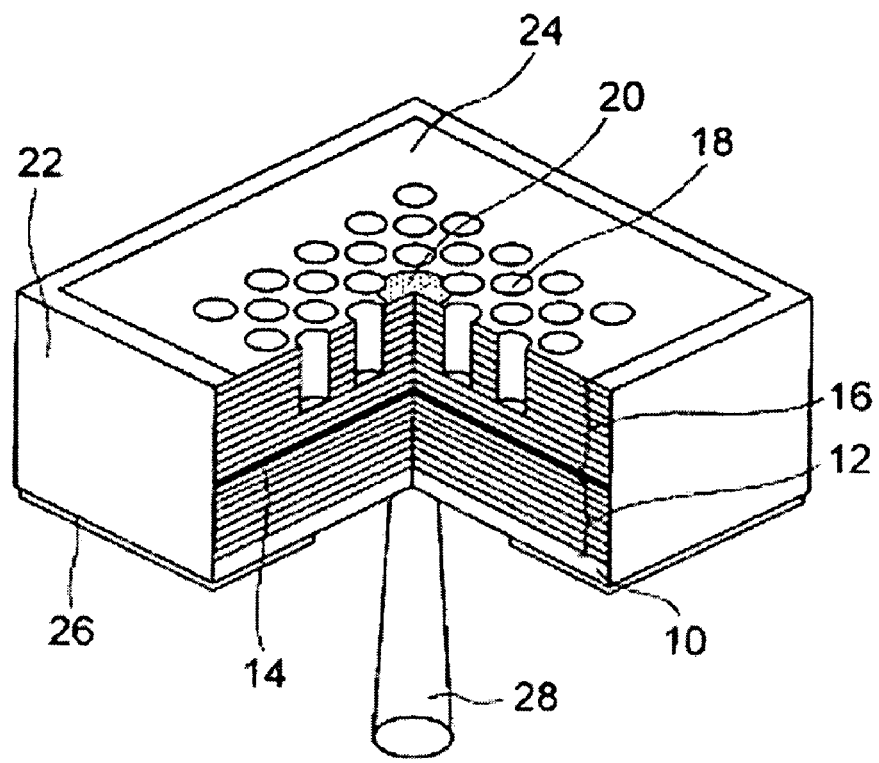
FIG. 1 is a partially sectional perspective view showing a photonic crystal surface emitting laser according to an embodiment of the present invention.

A surface emitting laser according to an embodiment of the present invention is shown in FIG. 1. The surface emitting laser has a lamination structure formed on a substrate 10, including a lower reflecting mirror structure 12, a cladding layer (not shown), a quantum well active layer (luminescence layer) 14, a cladding layer (not shown), and an upper reflecting mirror structure 16. The substrate 10 is formed of a material which is transparent to oscillating laser light. Holes 18 are arranged in a two-dimensional periodic pattern in the upper reflecting mirror structure 16, and two-dimensionally arranged holes with a point defect in the central portion of the arrangement, a region with no hole formed therein, are formed.

An upper electrode 20 is provided on the point defect region in the central portion. The lower electrode 26 is provided on the peripheral region excluding a laser emission region of the central portion. An insulating film 22 is formed on a surface of the two-dimensional hole arrangement surrounding the upper electrode 20, internal surfaces of the holes, and a side face of the element. Furthermore, an electrode pad 24 is formed on the insulating film 22, and is connected to the upper electrode 20 via a central aperture formed in the insulating film 22.

A reflectivity of the lower reflecting mirror structure 12 is set smaller than a reflectivity of the upper reflecting mirror structure 16, so that a laser beam 28 is emitted through the lower reflecting mirror structure 12. By taking a structure in which the laser beam 28 is emitted through the lower reflecting mirror structure 12, the upper electrode 20 can be formed on the defect of hole of the two-dimensional hole arrangement, with no hole formed therein, located in the central portion of the upper reflecting mirror structure 16. The insulation film 22 is formed around the upper electrode 20, so as to protect a surface of the element and to prevent current injection from the portion other than the portion where the upper electrode 20 is formed. The two-dimensional hole arrangement with the point defect is designed for the surface emitting laser to lase in the fundamental transverse mode.

As described above, in the structure of the surface emitting laser 100, the upper electrode 20 is formed only on the point defect region in the center of the two-dimensional hole arrangement. The portion of the photonic crystal where the two-dimensional hole arrangement is formed has a large electrical resistance to the current that flows spreading from the point defect portion due to the existence of the holes. Therefore, the point defect region of the two-dimensional hole arrangement constitute a low resistance region.

Since the current injected from the point defect region selectively flows through the low resistance region, the above structure functions as a current constriction structure that increase the light emission efficiency. Furthermore, by adopting such a structure, a complicated process of forming a constriction structure such as the oxidation constriction or ion-implanting constriction is not required, so that it is possible to simplify the manufacturing process of the laser.

FIG. 2 to FIG. 5 are perspective views sequentially showing manufacturing processes of the photonic crystal surface emitting laser of FIG. 1. An oscillation wavelength of the surface emitting laser is designed to be 1300 nm, at which a GaAs substrate 10 is transparent. First, a lower reflecting mirror structure 12 is grown on an n-type GaAs substrate 10 by MOCVD method. The lower reflecting mirror structure 12 is constituted by a multilayer film of 25 pairs of alternately laminated n-type $Al_{0.9}Ga_{0.1}As$ layer and n-type GaAs layer, each of the layers having a thickness of $\lambda/4n$ (where $\lambda$ is an oscillation wavelength, and n is a refractive index). A carrier concentration of each layer is set to $1\times10^{18} cm^{-3}$.

Then, a lower cladding layer (not shown), a luminescence layer 14 including three layers of a GaInNAsSb/GaAs quantum well structure, and an upper cladding layer (not shown) are sequentially grown in this order on the lower reflecting mirror structure 12 by a gas source MBE method. Further, an upper reflecting mirror structure 16 is grown by a MOCVD method again. The upper reflecting mirror structure 16 is constituted by a multilayer film of 35 pairs of alternately laminated p-type $Al_{0.9}Ga_{0.1}As$ layers and p-type GaAs layers, each of the layers having a thickness of $\lambda/4n$. A carrier concentration of each layer is set to $1\times10^{18} cm^{-3}$. A reflectivity of the lower reflecting mirror structure 12 is set smaller than that of the upper reflecting mirror structure 16, and laser light is emitted through the lower reflecting mirror structure 12.

Figure 2:
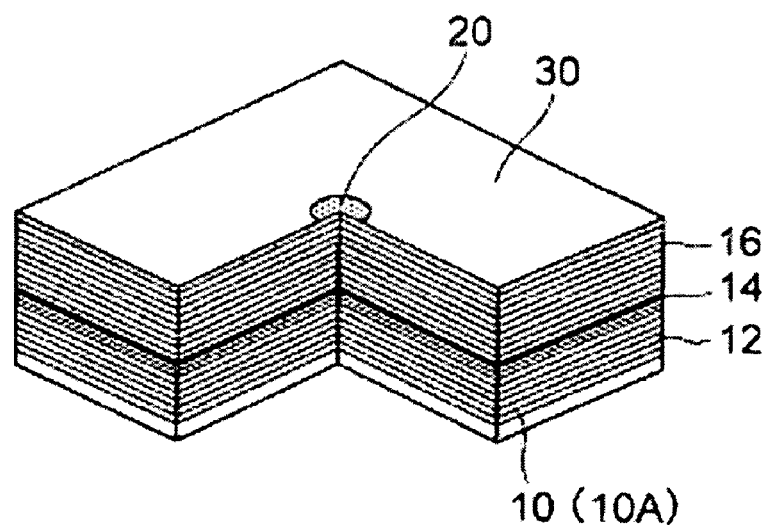
FIG. 2 is a perspective view showing one of manufacturing steps of the photonic crystal surface emitting laser shown in FIG. 1.

Then, a SiNx film 30 is deposited on a surface of the abovementioned lamination structure by a plasma CVD method. A circular aperture of 10 μm in a diameter is formed in a central portion of the SiNx film 30 by photolithography using photoresist and RIE (Reactive Ion Etching). AuZn is deposited in the aperture to form the circular shaped upper electrode 20. In this way, the structure shown in FIG. 2 is obtained.

Next, a resist for electron beam lithography is overlaid on the surface. A two-dimensional hole arrangement structure in a triangular lattice pattern with an arrangement period of 5 μm and a hole diameter of 2 μm is formed on the resist film by electron beam lithography. In the present embodiment, the hole arrangement structure has a point defect, where only one of the holes 18 is omitted thereat, in the central portion of the hole arrangement structure.

The hole arrangement, an area of the point defect region and a depth of the holes are designed so that a single transverse mode oscillation is achieved based on a difference between a refractive index in the point defect region and an average refractive index in the region surrounding the point defect region.

Figure 7:
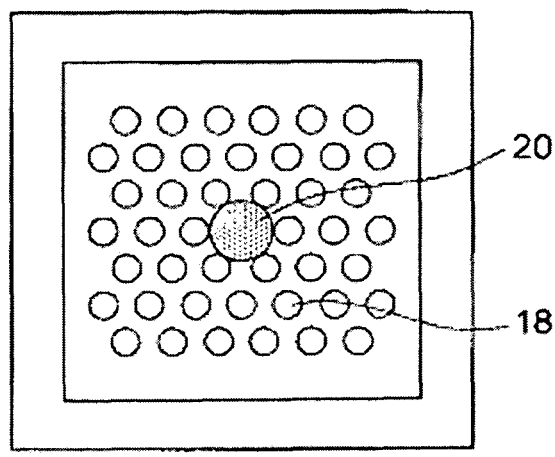
FIG. 7 is a plan view showing an example of a point defect of a two-dimensional hole arrangement.
Figure 8:
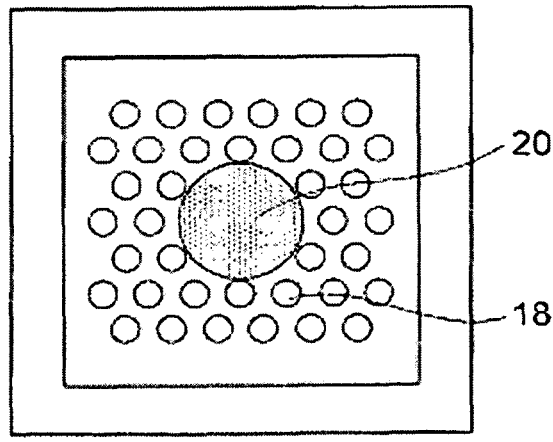
FIG. 8 is a plan view showing an example of a point defect of the two-dimensional hole arrangement.
Figure 9:
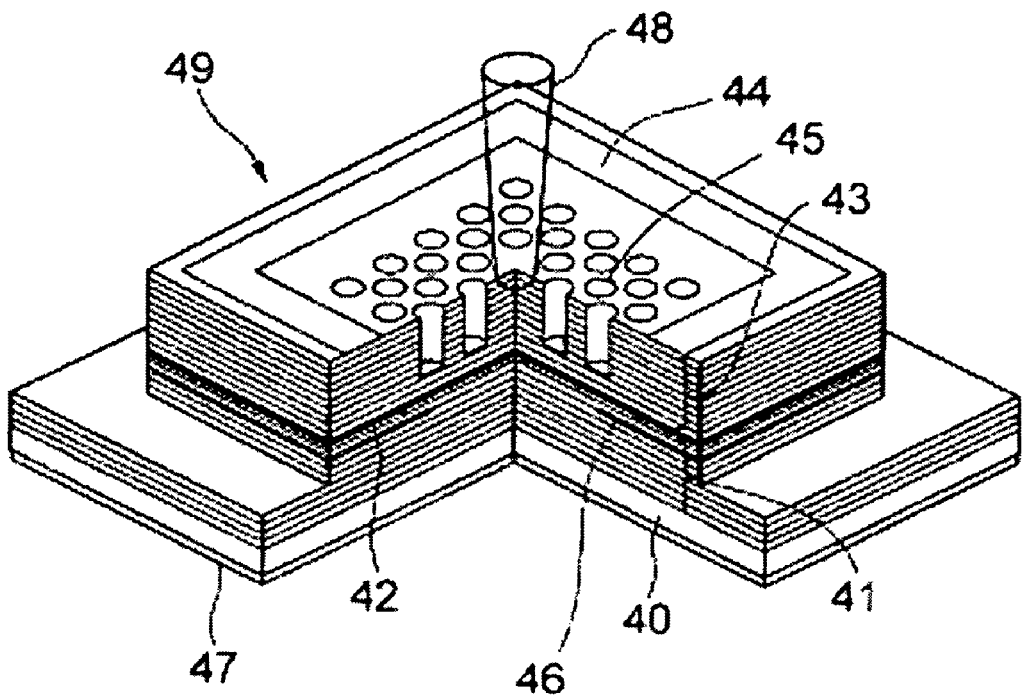
FIG. 9 is a perspective view showing a conventional photonic crystal surface emitting laser.
Figure 10:
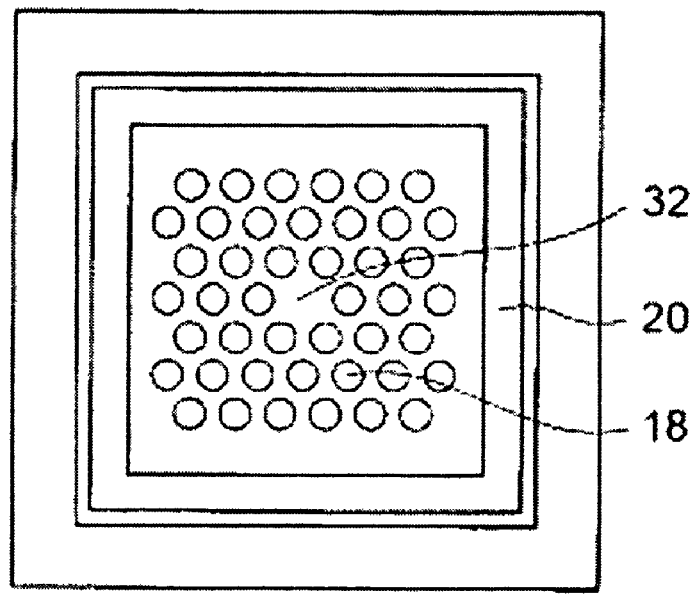
FIG. 10 is a top plan view showing the conventional photonic crystal surface emitting laser shown in FIG. 9.

In the present embodiment, a point defect where only central one of the holes is omitted is adopted. The point defect structure of a single hole is shown in FIG. 7. The point defect may be a defect where not less than one of the holes are omitted, as long as the single transverse mode oscillation is achieved. For example, the point defect may be a defect where seven of the holes are omitted, as shown in FIG. 8. In addition, a cross section of the hole is not necessarily a circle, and may be an arbitrary shape such as a triangle or a quadrilateral.

Figure 3:
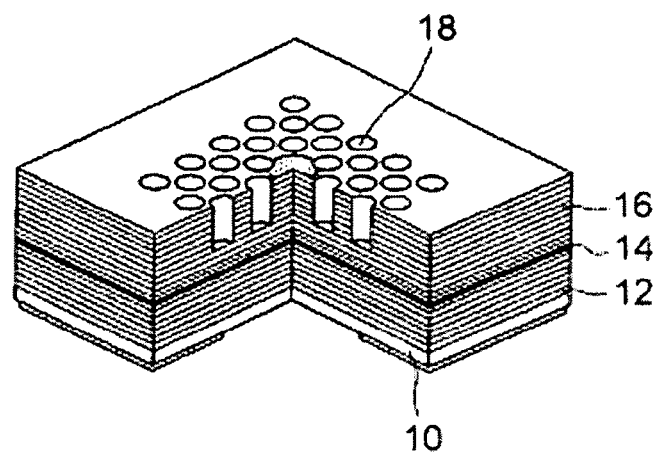
FIG. 3 is a perspective view showing a manufacturing step subsequent to FIG. 2.

In forming the two-dimensional hole arrangement, the circular hole arrangement pattern is transferred onto the SiNx film 30 by RIE using $CF_4$. Then, the hole arrangement structure, in which the holes 18 having a depth of 5 μm are two-dimensionally arranged, is formed in the layers of the upper reflecting mirror structure 16 by ICP (Inductively-coupled plasma) dry etching using $Cl_2$, with the hole arrangement structure of the SiNx film pattern as a mask. Furthermore, the SiNx film 30 is thoroughly removed by RIE. Thus, the structure as shown in FIG. 3 is obtained.

Figure 4:
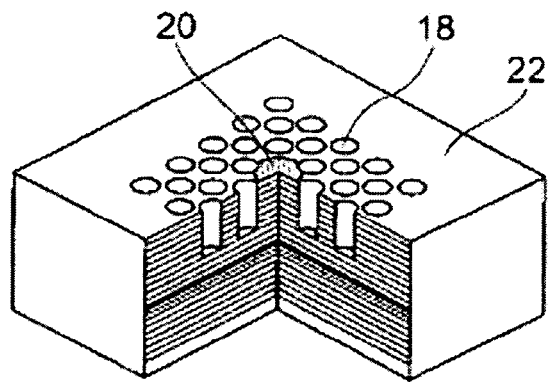
FIG. 4 is a perspective view showing a manufacturing step subsequent to FIG. 3.
Figure 6:
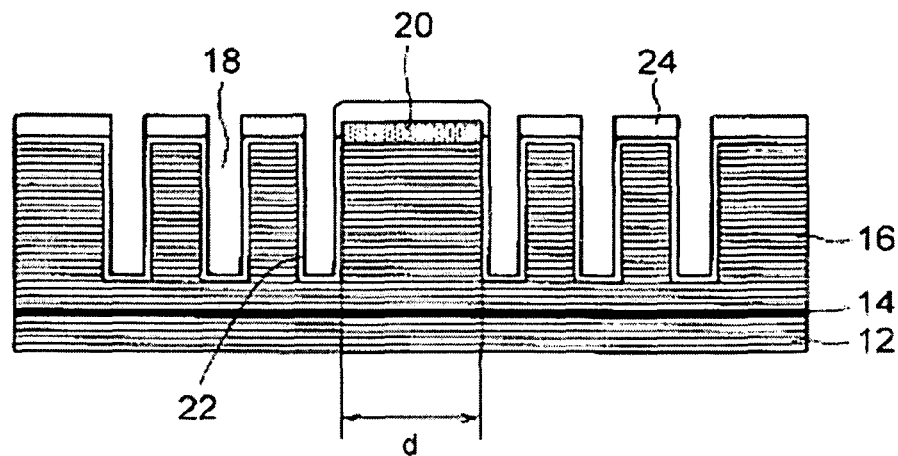
FIG. 6 is a sectional view showing the manufacturing step shown in FIG. 4.

Then, the top surface including internal surfaces of the holes 18 and excluding the surface of the upper electrode 20, and the sides of the element is coated with a SiNx film 22, resulting in the structure shown in FIG. 4. And then, an electrode pad 24 for connection to the electrode is formed on the top, for example, with a Ti/Pt/Au film. The upper electrode 20 is in contact with the semiconductor lamination structure beneath the SiNx film 22 only in the vicinity of the point defect region of the hole arrangement, where the hole is absent. FIG. 6 shows a cross sectional view of the surface emitting laser at this stage.

A diameter d of the current aperture (a portion where the upper electrode 20 is formed, including the point defect and surrounded by the holes) beneath the upper electrode 20 is about 10 μm, so the luminescence occurs over a wide luminescent area of about 80 μm². At the current aperture, because the hole is absent, an efficient current constriction is possible. In addition, due to the small refractive index difference between the point defect region and the surrounding two dimensional hole arrangement, an optical confinement based on a single transverse mode is realized. The depth of the hole 18 corresponds to about 25 pairs out of 35 pairs of the upper reflecting mirror structure 16. Preferably, the depth of the hole may be about 0.5:1 to 0.9:1 in terms of a ratio to the thickness of the upper reflecting mirror structure 16.

Figure 5:
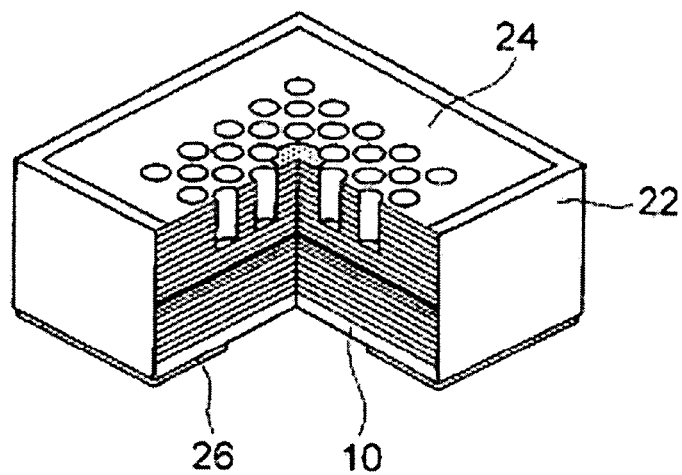
FIG. 5 is a perspective view showing a manufacturing step subsequent to FIG. 4.

Then, a bottom surface of the GaAs substrate 10 is coated with a photoresist, which thereafter is removed by photolithography except for a circular area of 50 μm in diameter. A lower electrode 26 is formed of a Ti/Pt/Au film on the bottom surface of the GaAs substrate 10 exposed on the outer region surrounding the circularly-left photoresist. Thereafter, the photoresist is removed and the surface emitting laser shown in FIG. 5 is obtained.

A computer simulation was conducted to estimate characteristics of the surface emitting laser in the above embodiment, which gave an estimation of 35 ohms for the element resistance. In addition, an actual fabrication of the element showed the fundamental transverse mode oscillation at a threshold current of 2 mA. Thus, according to the present invention, it is possible to make the surface emitting laser with the low element resistance, capable of easy manufacturing, and capable of the fundamental transverse mode oscillation, without forming a complicated current constriction structure such as an oxidization constriction or ion-implanting constriction.

A surface emitting laser of the present embodiment is designed to have an oscillation wavelength of 1,100 nm at which a GaAs substrate is transparent. A basic manufacturing method of the element in the present embodiment is similar to that in the first embodiment. Therefore, the manufacturing method is explained below with reference to FIG. 2 to FIG. 5.

First, a lower reflecting mirror structure 12 is grown on a p-type GaAs substrate 10A by an MOCVD method. The lower reflecting mirror structure 12 is constituted of a multilayer film of 25 pairs of alternately laminated p-type $Al_{0.9}Ga_{0.1}As$ layers and p-type GaAs layers, each of the layers having a thickness of $\lambda/4n$ (where $\lambda$ is an oscillation wavelength, and n is a refractive index). A carrier concentration of each layer is set to $1 \times 10^{18}$ cm$^{-3}$. Then, a lower cladding layer (not shown), a luminescence layer 14 including three layers of a GaInAs/GaAs quantum well structure, and an upper cladding layer (not shown) are sequentially grown in this order on the lower reflecting mirror structure 12. Further, an upper reflecting mirror structure 16 is grown on the upper cladding layer. The upper reflecting mirror structure 16 is constituted of a multilayer film of 35 pairs of alternately laminated n-type $Al_{0.9}Ga_{0.1}As$ layers and n-type GaAs layers, each of the layers having a thickness of $\lambda/4n$. A carrier concentration of each layer is set to $1 \times 10^{18}$ cm$^{-3}$.

Then, a SiNx film 30 is deposited on the above-mentioned lamination structure by a plasma CVD method. The SiNx film 30 is removed to form a circular aperture of 10 μm in a diameter by photolithography using photoresist and RIE (Reactive Ion Etching). An AuGeNi/Au film is deposited in the aperture where the SiNx film 30 is removed to form the circular shaped upper electrode 20.

Next, a resist for electron beam lithography is overlaid on the surface. A hole arrangement structure in a triangular lattice pattern with an arrangement period of 5 μm and a hole diameter of 2 pm is formed on the resist film by electron beam lithography. Subsequently, the circular hole arrangement pattern is transferred onto the SiNx film 30 by RIE using $CF_4$. Then, the hole arrangement structure, in which the holes 18 having an about 4 μm depth are arranged, is formed in the layers of the upper reflecting mirror structure 16 by ICP (Inductively-coupled plasma) dry etching using $Cl_2$, with the hole arrangement structure of the SiNx film pattern as a mask. Furthermore, the SiNx film 30 is thoroughly removed by RIE.

Then, the outer region surrounding the upper electrode 20, including internal surfaces of the holes 18 and excluding the surface of the upper electrode 20, are coated with a SiNx film 22. And then, an electrode pad 24 for connection to the electrode is formed on the top, for example, with a Ti/Pt/Au film. All the sides of the above-mentioned hole arrangement also are coated with an insulating film (SiNx film) 22. The upper electrode 20 is in contact with the semiconductor lamination structure only in the vicinity of the point defect region of the hole arrangement, where the hole is absent. Then, a bottom surface of the GaAs substrate 10 is coated with a photoresist, which thereafter is removed by photolithography except for a circular area of 50 μm in a diameter. A lower electrode 26 is formed of a Ti/Pt/Au film on the bottom surface of the p-type GaAs substrate 10A exposed on the region surrounding the photoresist. Thereafter, the photoresist is removed.

A computer simulation was conducted to estimate the characteristics of the surface emitting laser of the present embodiment, which gave an estimation of 30 ohms for the element resistance. In addition, an actual fabrication of the element showed the fundamental transverse mode oscillation at a threshold current of 2.5 mA.

In the present embodiment, because the p-type GaAs substrate is used, the two-dimensional hole arrangement is formed in the n-type semiconductor layers where the carrier mobility is large. Therefore, the element resistance is further reduced as compared with the embodiment 1 in which the two-dimensional hole arrangement is formed in the p-type semiconductor layers. On the other hand, in the present embodiment, because of a reduced effect of the current constriction caused by an increased lateral spreading of carriers, the threshold current is a little bit larger than the previous embodiment.

As described above, according to the present invention, it is possible to make the surface emitting laser with the low element resistance, capable of easy manufacturing, and capable of achieving the fundamental transverse mode oscillation, without forming a current constriction structure by a complicated process such as an oxidization constriction or ion-implanting constriction.

Although the present invention is described based on the preferred embodiments thereof, the surface emitting laser of the present invention is not limited to the above embodiments, and a variety of alterations and modifications made from the configurations of the above embodiments will fall within the scope of the present invention. Furthermore, although each element described as a preferred mode of the present invention, or each element described in the embodiments are desired to be used with the indispensable element of the present invention, the element which by itself provides a beneficial effect need not to be necessarily used with all the elements described as an indispensable element of the present invention.

The invention claimed is:

1. A surface emitting semiconductor laser element comprising:
   a substrate;
   a lamination structure formed on the substrate, said lamination structure including a lower reflecting mirror structure, an upper reflecting mirror structure, and a luminescence layer disposed between the lower reflecting mirror structure and the upper reflecting mirror structure, said lower reflecting mirror structure having a reflectivity smaller than that of the upper reflecting mirror structure;
   a two-dimensional hole arrangement with a hole defect having no hole formed therein at a central portion thereof formed in the upper reflecting mirror structure to achieve laser oscillation in a fundamental transverse mode;

an upper electrode covering an entire area of the hole defect at the central portion of the two-dimensional hole arrangement;

an insulation film formed adjacent to the upper electrode and surrounding the central portion of the two-dimensional hole arrangement; and an electrode pad formed on the insulation film and the upper electrode.

2. The surface emitting semiconductor laser element according to claim 1, wherein said substrate is formed of an n-type GaAs substrate.

3. The surface emitting semiconductor laser element according to claim 1, wherein an oscillation wavelength is not less than 1.1 µm and not greater than 1.6 µm.

4. The surface emitting semiconductor laser element according to claim 1, wherein said luminescence layer includes a multiple quantum well structure formed of GaInNAsSb.

5. The surface emitting semiconductor laser element according to claim 1, wherein said luminescence layer includes a multiple quantum well structure formed of GaInAs.

6. The surface emitting semiconductor laser element according to claim 1, wherein said upper electrode has an area greater than that of the hole defect.

7. The surface emitting semiconductor laser element according to claim 1, wherein said upper electrode is formed in a circular shape to cover a center of the hole defect.

8. The surface emitting semiconductor laser element according to claim 1, further comprising a lower electrode disposed on a backside surface of the substrate opposite to the lamination structure, said lower electrode having an opening so that light emitted from the luminescence layer passes through the opening toward an opposite direction of the upper electrode.

* * * * *